United States Patent
Shimamura et al.

(10) Patent No.: US 6,843,842 B2
(45) Date of Patent: Jan. 18, 2005

(54) GLASS COATING AGENT AND METHOD FOR COATING GLASS MATERIAL USING THE SAME

(75) Inventors: Eihaku Shimamura, Chou-ku (JP); Katsuhiro Imashita, Chou-ku (JP); Tsutomu Amano, Chuo-ku (JP); Tatsuya Nagai, Chuo-ku (JP); Takayuki Okada, Higashi-Yodogawa-ku (JP); Hitoshi Tabuchi, Higashi-Yodogawa-ku (JP); Masaaki Katayama, Higashi-Yodogawa-ku (JP)

(73) Assignee: Kirin Beer Kabushiki Kaisha, Tokyo-to (JP)

( * ) Notice: Subject to any disclaimer, the term of this patent is extended or adjusted under 35 U.S.C. 154(b) by 0 days.

(21) Appl. No.: 10/303,840

(22) Filed: Nov. 26, 2002

(65) Prior Publication Data

US 2003/0108676 A1 Jun. 12, 2003

Related U.S. Application Data

(63) Continuation of application No. 09/415,057, filed on Oct. 12, 1999, now abandoned.

(30) Foreign Application Priority Data

Oct. 12, 1999 (JP) ............................................ 10-289497

(51) Int. Cl.$^7$ .............................. C09K 3/00; C07F 7/28; C07F 7/02; C07F 5/06
(52) U.S. Cl. ............................ 106/287.16; 106/287.17; 106/287.19; 556/1; 556/55; 556/90; 556/183; 556/442
(58) Field of Search ....................... 106/287.16, 287.17, 106/287.19; 556/1, 55, 90, 183, 442

(56) References Cited

FOREIGN PATENT DOCUMENTS

JP 62-287260 * 12/1987

OTHER PUBLICATIONS

Mokal et al., Journal of Organometallic Chemistry, vol. 441, No.2, pp. 215–226 (1992).*

* cited by examiner

Primary Examiner—Porfirio Nazario-Gonzalez
(74) Attorney, Agent, or Firm—Oblon, Spivak, McClelland, Maier & Neustadt, P.C.

(57) ABSTRACT

A glass coating agent is provided which is adapted for application onto the surface of a glass substrate and, upon heating, forms a metal oxide layer. The glass coating agent comprises a metallic compound represented by formula (I):

$$R^1{}_{k-m}M(OCOR^2)_m \qquad (I)$$

wherein M represents a metal atom selected from the group consisting of tin, titanium, indium, silicon, zirconium, and aluminum;

$R^1$ represents a straight-chain, branched, or cyclic alkyl, alkenyl, or aryl group having 1 to 6 carbon atoms;

$R^2$ represents a branched alkyl group having 3 to 6 carbon atoms;

k is a number representing the valence of the metal atom M; and m is a number of 1 to k.

Further, there is provided a glass coating method using the glass coating agent. According to the glass coating agent, a metal oxide layer having excellent fastness properties and free from haze can be formed on the surface of glass substrates. According to the glass coating method, the metal oxide layer can be continuously and stably produced.

8 Claims, 1 Drawing Sheet

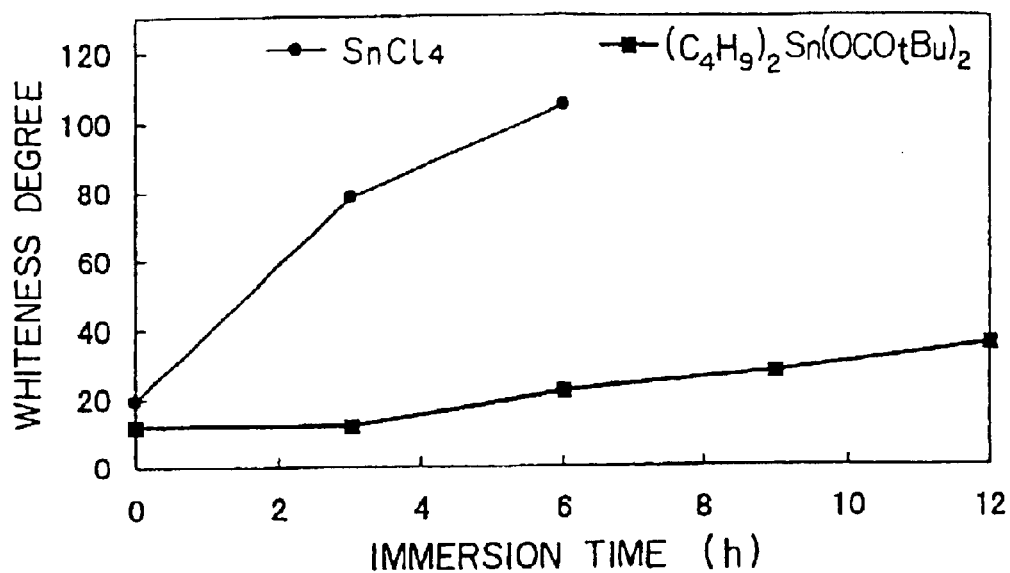
F I G. 1
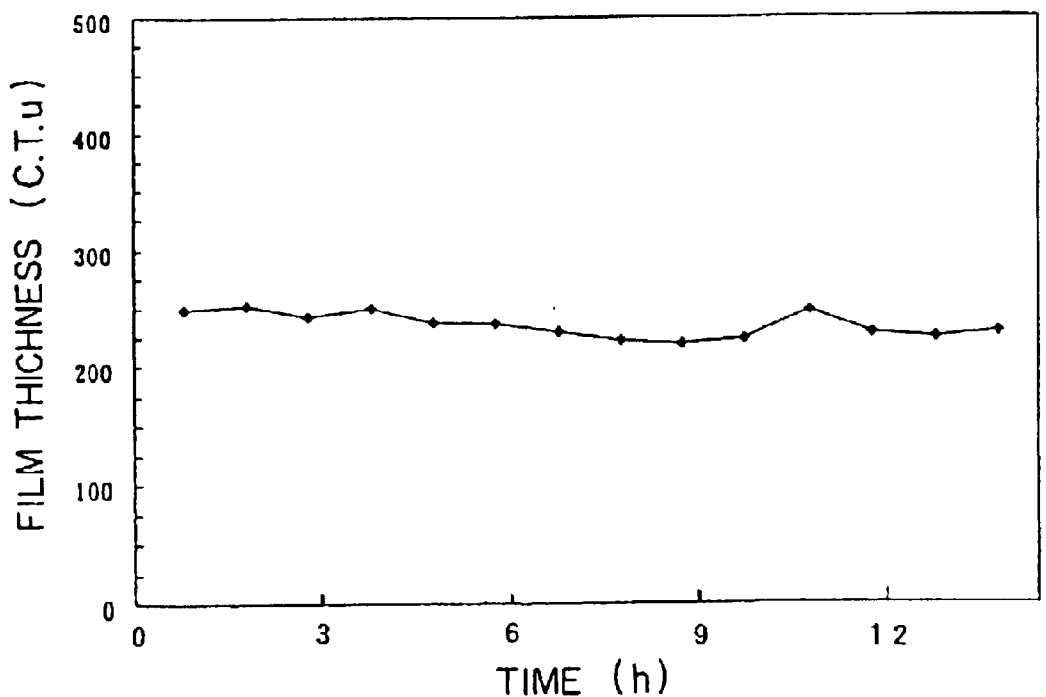
F I G. 2

GLASS COATING AGENT AND METHOD FOR COATING GLASS MATERIAL USING THE SAME

This application is a CON of Ser. No. 09/415,057 Oct. 12, 1999 abandoned.

FIELD OF THE INVENTION

The present invention relates to a glass coating agent which can form a high-quality metal oxide layer possessing excellent fastness properties and free from haze on the surface of glass, and particularly to a coating agent for glass bottles or glass plates.

The present invention also relates to a glass coating method which can continuously produce a metal oxide layer using a specified coating agent.

BACKGROUND OF THE INVENTION

Bringing a chlorine-containing tin compound in a gas or spray form into contact with a heated glass body to form a tin oxide layer on the surface of the glass body has been widely carried out (see, for example, Japanese Patent Laid-Open No. 19895/1984 or Japanese Patent Laid-Open No. 131547/1991). In these cases, however, NaCl produced by a reaction of sodium (Na) constituting the glass with chlorine (Cl) derived from the coating agent, together with tin oxide layer, is often deposited on the surface of glass. Thereafter, NaCl is dropped from the surface to create pinholes which constitute defects of the layer, resulting in lowered fastness properties of the layer and the creation of haze.

On the other hand, a method for coating an organotin compound, a chlorine-free tin agent, onto glass has also been reported (see Japanese Patent Publication No. 11234/1970). Use of the chlorine-free coating agent leads to an expectation that the creation of pinholes on the coating can be inhibited. So far as the present inventors know, however, in the case of the conventional coating method using the organotin compound, it is difficult to apply the method to continuous production of coated glass and, in addition, to put the method to practical use. In fact, Japanese Patent Publication No. 11234/1970 is silent on continuous production associated with coating.

According to studies conducted by the present inventors, the difficulty of continuously producing coated glass in the method described in Japanese Patent Publication No. 11234/1970 is considered to derive from the following facts.

Firstly most of the organotin compounds disclosed in Japanese Patent Publication No. 11234/1970 have unsatisfactory vaporization properties. Since the organotin compounds are liquid or solid at room temperature, they are generally heat vaporized and carried onto the surface of glass. In this case, poor vaporization properties lead to a chemical change of the organotin compound before vaporization. As a result, a part of the reactant is left within a vaporizer. This creates disadvantages, such as lowered vapor deposition efficiency due to a reduction in the amount of the material deposited on the glass based on the amount of the starting material introduced and the difficulty of repeatedly using the vaporizer in a continuous manner due to the residue within the vaporizer. For this reason, the practicability is lowered.

Further, in the surface having a relatively low temperature (temperature about 150 to 300° C.) called a "cold wall" within piping for carrying the starting material, the vaporized organotin compound in its ester bond sites and the like is influenced by water contained in the air and consequently causes a chemical reaction which often produces by-products due to the decomposition or polymerization of the organotin compound. The by-products are in many cases deposited or accumulated on the inner wall of the piping. Therefore, when the amount of the deposited or accumulated by-products exceeds a certain level, the operation of the production line should be stopped to remove the deposited or accumulated by-products. This makes it very difficult to carry out continuous production using the organotin compound.

Further, the organotin compound described in Japanese Patent Publication No. 11234/1970 cannot be used in a production line for glass coating in a system open to the air without difficulty. For example, when dibutyltin diacetate is used as the coating agent, a tin oxide layer having high quality and excellent fastness properties and free from haze can be applied onto the surface of glass under specific conditions, for example, in a closed system with the humidity being controlled at a certain value or less. On the other hand, it was confirmed that, in coating operation in a system open to the air, water in the air causes the decomposition or polymerization of dibutyltin diacetate in the vaporizer or on the inner wall of piping for the coating agent and on other cold walls and the resultant decomposition or polymerization product is deposited or accumulated thereon. The production of the above reaction product indicates that it is difficult to recover dibutyltin diacetate remaining unreacted and not deposited on the surface of glass. This makes it difficult to recycle the coating agent containing dibutyltin diacetate in a water-containing system open to the air.

In the actual glass production line, in many cases, coating is continuously carried out while carrying heated glass. The step of coating glass in the production line cannot be carried out without difficulty in a closed system rather than in a system open to the air and thus is unrealistic also from the viewpoint of economy.

In the system open to the air, a variation in components (particularly water) of the air, temperature, and pressure in the air depending upon seasons is indispensable. Therefore, the production of by-products by the above reaction is unavoidable.

For this reason, a glass coating method has been desired which is compatible with the conventional glass production process, can be applied to a system open to the air, and can continuously produce glass coating. Further, a glass coating agent has also been desired which can be utilized in the above glass coating method and can form a high-quality layer having excellent fastness properties and free from haze.

SUMMARY OF THE INVENTION

The glass coating agent according to the present invention is adapted for application onto the surface of a glass substrate and, upon heating, forms a metal oxide layer, said glass coating agent comprising a metallic compound represented by formula (I)

$$R^1_{k-m}M(OCOR^2)_m \qquad (I)$$

wherein M represents a metal atom selected from the group consisting of tin, titanium, indium, silicon, zirconium, and aluminum;

$R^1$ represents a straight-chain, branched, or cyclic alkyl, alkenyl, or aryl group having 1 to 6 carbon atoms;

$R^2$ represents a branched alkyl group having 3 to 6 carbon atoms;

k is a number representing the valence of the metal atom M; and m is a number of 1 to k.

The glass coating method according to the present invention comprises the step of coating a glass substrate with a glass coating agent comprising a metallic compound represented by formula (I) while holding the temperature of the glass substrate at 450 to 750° C. to form a metal oxide layer on the surface of the glass:

$$R^1{}_{k-m}M(OCOR^2)_m \quad (I)$$

wherein M represents a metal atom selected from the group consisting of tin, titanium, indium, silicon, zirconium, and aluminum;

$R^1$ represents a straight-chain, branched, or cyclic alkyl, alkenyl, or aryl group having 1 to 6 carbon atoms;

$R^2$ represents a branched alkyl group having 3 to 6 carbon atoms;

k is a number representing the valence of the metal atom M; and m is a number of 1 to k.

The glass coating method according to the present invention can continuously produce a metal oxide layer possessing excellent fastness, particularly excellent fastness to alkalis, and free from haze on the surface of glass substrates and, at the same time, can stably form oxide layers in the air.

The glass coating agent according to the present invention can form metal oxide layers possessing excellent fastness and free from haze on the surface of glass substrates.

BRIEF DESCRIPTION OF THE DRAWINGS

FIG. 1 is a diagram showing a change in degree of whitening caused by alkali immersion of a tin oxide layer formed using dibutyltin dipivalate or tin tetrachloride as a coating agent; and FIG. 2 is a diagram showing a change in layer thickness in continuous application of an oxide layer, using dibutyltin dipivalate as a coating agent, on a glass bottle in an actual line.

DETAILED DESCRIPTION OF THE INVENTION

In the glass coating method for applying a metal oxide layer on the surface of a glass substrate, specific requirements for the glass coating agent and the glass coating method are generally as follows.

(1) The production of by-products should be small. When by-products are produced by a chemical change in the coating agent, the production should be stopped for cleaning the production apparatus and other purposes, rendering the continuous production difficult.

(2) The glass coating agent should be selectively reacted on and can cover a solid (glass) surface in a specific temperature range, for example, 450 to 750° C., that is, at a temperature above the internal temperature of the production apparatus. When the reaction of the coating agent takes place at the internal temperature of the production apparatus, for example, at the internal surface temperature of the piping, and consequently leads to the covering of the internal surface with the resultant layer, the production should be stopped to remove the layer. This renders the continuous production difficult. When the glass coating agent can be reacted only in a very high temperature range, for example, in a temperature range above 750° C., the temperature of the glass substrate should be increased to that temperature range. In this high temperature range, however, the glass substrate is often deformed, and, hence, this glass coating agent is unsuitable.

(3) The carrier temperature of the glass coating agent should be 300° C. or below. This is because, when the vaporization temperature of the glass coating agent is excessively high, devices in the production apparatus, such as a fan for recirculation of the coating agent, are often damaged.

(4) Glass coating should be able to be carried out at the atmospheric pressure in the air composition. In particular, the coating agent should be less likely to be influenced by moisture. Since in many cases coating of glass is carried out in a system open to the air, a chemical change in the coating agent upon exposure to a component(s) of the air to produce by-products renders continuous production of the coated glass difficult.

(5) The formation rate of the metal oxide layer should be satisfactorily high. For example, the formation of the layer at a rate of not less than 10 nm/sec is preferred. Lower layer formation rate results in lowered glass temperature. This requires the provision of additional means for heat retention or heating.

(6) The dependence of the reaction rate upon the temperature should be small. The reason for this is as follows. In the case of coating in a system open to the air, large temperature dependence of the reaction rate often causes a variation in reaction rate between production lots according to the temperature of the atmosphere. Further, when the temperature of glass to be coated is uneven, in some cases, the layer quality in a single product is varied from portion to portion.

(7) The concentration of the coating agent in the carrier should be able to be kept constant, because a change in the concentration of the coating agent in the carrier due to the production of by-products leads to a change in coating conditions which is likely to cause a change in layer thickness.

(8) The reactivity of the reaction gas or the evolved gas in the reaction other than the metal layer formation reaction is low. For example, the corrosive properties or explosive properties should be low. This is because the coating agent should be easy to handle.

(9) The internal temperature of the chamber should be low, for example, 100 to 300° C. When the internal temperature of the chamber is excessively high, the carrier temperature of the coating agent is increased, often leading to damage to devices in the production apparatus, such as a recirculation fan. On the other hand, when the internal temperature is excessively low, it is difficult to hold the glass substrate at a film-formable temperature.

The glass coating agent according to the present invention can satisfy all of the above requirements in an actual glass coating process.

<Glass Coating Agent>

The coating agent for glass bottles or glass plates according to the present invention comprises a metallic compound represented by formula (I):

$$R^1{}_{k-m}M(OCOR^2)_m \quad (I)$$

wherein M represents a metal atom selected from the group consisting of tin, titanium, indium, silicon, zirconium, and aluminum. These metal atoms may take any one of monovalent to tetravalent states. According to the glass coating agent of the present invention, the metal atoms may take any of these valences. A trivalent or tetravalent state, however, is preferred from the viewpoint of the stability of the compound. Specific examples of preferred compounds include tin(IV), titanium(IV), indium(III), silicon(IV), zirconium (IV), and aluminum(III). k is a number representing the valence of the metal atom M.

In formula (I), $R^1$ represents a straight-chain, branched, or cyclic alkyl, alkenyl, or aryl group having 1 to 6 carbon atoms. Preferably, $R^1$ represents a straight-chain or branched alkyl or alkenyl group having 1 to 4 carbon atoms or an aryl group having 6 carbon atoms. Specific examples of $R^1$ usable herein include methyl, ethyl, n-propyl, i-propyl, n-butyl, t-butyl, vinyl, allyl, isopropenyl, butenyl, 1-ethylvinyl, phenyl, cyclohexyl, and other groups.

In formula (I), $R^2$ represents a branched alkyl group having 3 to 6 carbon atoms. Specific examples of $R^2$ usable herein include isopropyl, t-butyl, i-butyl, 1,1-dimethylpropyl, 1,2-dimethylpropyl, 2,2-dimethylpropyl, 1-ethylpropyl, 2-ethylbutyl, and other groups. Among them, the t-butyl group is particularly preferred. At that time, the $OCOR^2$ group is a pivaloyl group.

According to the glass coating agent of the present invention, $R^2$ does not embrace straight-chain alkyl groups. When $R^2$ represents a straight-chain alkyl group, for example, hydrogen, methyl, ethyl, n-propyl, or n-butyl, the vaporization properties are unsatisfactory and, in addition, rising the temperature in many cases results in the formation of sparingly volatile by-products. For this reason, $R^2$ should represent a branched alkyl group.

Although $R^1$ and $R^2$ may be as defined above, the proportion of the metal generally increases with reducing the number of carbon atoms. Therefore, a smaller number of carbon atoms is more advantageous for efficiently forming the metal oxide layer. Further, in general, there is a tendency that a smaller number of carbon atoms offers better vaporization properties and hence can realize vaporization at a lower temperature.

In formula (I), m represents the number of $OCOR^2$ groups and is a number of 1 to k.

When m is 0 (zero), that is, when the compound represented by formula (I) as the coating agent is a tetraalkyl metal(IV) compound or a trialkyl metal(III) compound, substantially the whole quantity thereof was vaporized at a predetermined temperature. This is considered attributable to the fact that, since these compounds are chemically stable, they are likely to be vaporized before the chemical reaction. These compounds, however, have poor reactivity, and, according to studies conducted by the present inventors, it has been difficult to form a necessary and satisfactory film on glass of 650° C.

Increasing m is likely to improve the reactivity. When m is k, however, the stability in a low temperature range of about 200° C. after the vaporization is so low that by-products produced as a result of decomposition are likely to be deposited or accumulated on the internal surface of piping or the like.

Therefore, when this coating agent is used for continuously conducting coating, m=2 is particularly preferred from the viewpoint of providing good balance between vaporization properties and the production of by-products.

The metallic compounds represented by formula (I) have excellent vaporization properties and are suitable for use in the glass coating method according to the present invention described below. Specific examples of such compounds include dibutyltin dipivalate, dibutyltin diisobutylate, dibutyltin dineoheptate, dibutyltindiisolactate, monobutyltintripivalate, monomethyltin tripivalate, monobutyltin triisobutylate, dimethyltin dipivalate, dimethyltin diisobutylate, stannous pivalate, stannic pivalate, tributylsilyl pivalate, triisopropylsilyl pivalate, triisopropylsilyl isobutylate, dibutylsilyl dipivalate, diisopropylsilyl dipivalate, diphenylsilyl dipivalate, monophenylsilyl tripivalate, dimethyltitanium dipivalate, monobutylindium dipivalate, and diethylzirconium dipivalate.

The glass coating agent according to the present invention comprises the compound represented by formula (I). If necessary, it may comprise two or more compounds selected from the compounds represented by formula (I). Further, the glass coating agent according to the present invention may contain optional additives so far as they are not detrimental to the effect of the present invention. When coating of the glass coating agent as a liquid onto a glass substrate is contemplated, the glass coating agent may be used as a dispersion or solution thereof in a suitable solvent. On the other hand, when the glass coating agent is vaporized and, in this state, is applied onto a glass substrate, preferably, the above metallic compounds are used alone or in combination of two or more as the glass coating agent from the viewpoint of preventing the production of by-products.

The compound represented by formula (I) may be produced by any method. For example, the compound represented by formula (I) may be easily produced from a corresponding metal methoxide or oxide and a corresponding acid by a demethanolation or dehydration reaction.

<Glass Coating Method>

According to the glass coating method of the present invention, a metal oxide layer is formed using the glass coating agent, described above, on the surface of a glass substrate. The glass coating method of the present invention will be described in more detail.

The glass coating agent according to the present invention may be applied onto any glass substrate. The applied glass coating agent is reacted to form a metal oxide layer having various functions. Examples of such functions include the function of physically protecting the surface of the glass substrate, the function of imparting electrical conductivity by the surface layer and other functions. For example, when M in formula (I) represents tin or indium, the oxide layer has transparent electrical conductivity and the like and thus can be a layer having a higher function.

In particular, when M in formula (I) is tin, for example, transparent electrical conductivity, selective light transmission properties, electrical conductivity, semiconductive properties, lubricity and other functions corresponding to properties inherent in $SnO_2$ can be imparted to the layer. More specifically, the $SnO_2$ layer formed by the glass coating agent according to the present invention may be used as (i) buffer protective layers for glass bottles and glass plates (lubricity), (ii) layers for covering window glass of solar cells, heating glass for panel heaters, and electromagnetic wave reflection layers for electric wave cut-off windows (transparent electrical conductivity), (iii) heat reflection layers for luminescence lamps and heat lamps (selective light transmission), (iv) conductive layers for circuit resistors or fluorescent lamps and antistatic layers for CRT and the like (electrical conductivity), and (v) photoelectric transducers for photoconductive devices, business computers and the like (semiconductive properties) and in other applications.

The glass coating agent according to the present invention may be used on any glass substrate according to purposes. Use of the glass coating agent in glass bottles or glass plates is particularly preferred. Use of the glass coating agent according to the present invention to these glass substrates permits shock strength and electrical conductivity to be imparted to the glass substrates.

The glass coating agent according to the present invention is generally applied as a gas or a liquid onto glass substrates. When application of the glass coating agent as the liquid is contemplated, examples of methods for forming the liquid include heat melting and dissolution or dispersion in a suitable solvent. The liquid coating agent may be coated onto glass substrate by any method, such as spray coating, dip coating, or brush coating.

For the formation of a gas, a general and preferred method is to heat the glass coating agent to vaporize the glass coating agent. The temperature at which the glass coating agent is vaporized may be adjusted according to the kind of the glass coating agent, the thickness of the layer to be formed, and other conditions. When this temperature is excessively low, however, the amount of the coating agent vaporized is often so small that the thickness of the formed layer is unsatisfactory. On the other hand, when the temperature is excessively high, care should be taken so as not to produce by-products.

The gasified glass coating agent is guided to the surface of the glass substrate, coated on the surface of the glass substrate, and then heat reacted to form a metal oxide layer. Methods usable for heating the glass coating agent applied onto the surface of the glass substrate include heating of the glass substrate, with the glass coating agent coated thereon, in a heating furnace or the like and application of infrared light or the like. In the glass coating method according to the present invention, the glass substrate before coating of the glass coating agent thereon is previously held at such a temperature as will cause an oxide formation reaction, and a metal oxide layer is formed simultaneously with coating of the coating agent. This method is advantageous particularly in the production process of glass bottles. The reason for this is that, immediately after molding in the glass bottle production process, since the glass bottle is in a high temperature state, the residual heat can be utilized eliminating the need to additionally provide any special heating means. The temperature, however, is preferably such that the temperature of the glass bottle is not rapidly lowered.

Thus, according to the method of the present invention, a metal oxide layer is formed on the surface of the glass substrate. The metal oxide layer thus formed is a high-quality layer possessing excellent fastness properties and free from haze.

The glass coating method according to the present invention, in cooperation with the properties of the specific glass coating agent used, enables continuous glass coating in the air without any particular control of the temperature or humidity.

EXAMPLES

Example 1

Vaporization Property Measurement Test

Vaporization properties of glass coating agents were investigated by thermogravimetric differential thermal analysis (TG-DTA). Dibutyltin dipivalate and dibutyltin diacetate were provided as glass coating agents. For each coating agent, a reduction in weight of the coating agent upon heating at a temperature rise rate of 10° C./min in the air was measured.

Of these coating agents, dibutyltin dipivalate had better vaporization properties, and caused a rapid weight reduction at about 200° C. to finally leave only several % of residue.

Further, these coating agents were held at a predetermined temperature, and the measurement of TG-DTA was continued until the weight reduction did not occur any longer. In this case, the proportion of the residue (% by weight) was determined. The results were as shown in Table 1.

TABLE 1

Amount of residue after holding at constant temperature

| Glass coating agent | 150° C. | 185° C. |
|---|---|---|
| Dibutyltin dipivalate | 19.8 | 10.3 |
| Dibutyltin diacetate (comparative) | 41.4 | 16.8 |

(Unit: % by weight)

The results demonstrate that dibutyltin dipivalate had the best vaporization properties.

Example 2

Coating Test

A given amount of dibutyltin dipivalate was placed in a vaporizer, heated to a vaporization temperature by means of a heater, and then held at that temperature. The air heated in the vaporizer was bubbled and further mixed to regulate the concentration of dibutyltin dipivalate. The gas thus obtained was sprayed directly onto a glass plate heated at 650° C. through piping or the like for a given period of time. Thus, a metal oxide layer was formed on the glass plate. The thickness of the layer thus obtained was measured with an optical layer thickness measuring device. In this case, a layer having satisfactory thickness could be obtained in several seconds.

The glass plate with the layer formed thereon was immersed in a 4% aqueous alkali solution at 80° C. for 4 hr, and the layer was then observed under an electron microscope or the like. As a result, when the thickness of the metal oxide layer exceeded a certain value, any chemical reaction did not take place at all and, in this case, observation under an electron microscope did not show the presence of any pinhole.

Example 3

Test on Deposition/Accumulation within Piping

Deposition or accumulation of a coating agent was examined by continuously flowing a coating agent-containing carrier gas, which had been formed in the same manner as in Example 2, for one hr through 1.5 m-long glass piping which had been previously set so that the internal surface thereof had a temperature gradient of 200 to 50° C.

When dibutyltin diacetate was used as the coating agent, a white deposition or accumulation product was found on the surface in its portion having a temperature of about 200° C. The deposition or accumulation product was a material composed mainly of dibutyltin oxide, a by-product of dibutyltin diacetate.

On the other hand, when dimethyltin dipivalate or dibutyltin dipivalate was used as the coating agent, neither deposition nor accumulation product was present on the surface in its portion having a temperature of about 200° C.

Example 4

Test on Vapor Deposition onto Flat Glass Plate

An $SnO_2$ layer was formed by CVD at the atmospheric pressure on the surface of a flat glass plate, and the layer was then evaluated.

A coating agent containing tin tetrachloride or dibutyltin dipivalate was heated to a predetermined temperature to vaporize the coating agent. The vaporized coating agent was mixed with air containing a given amount of water to prepare a mixed gas which was then carried, through glass piping kept at a predetermined temperature, to a flat glass plate (50 mm×80 mm) heated to 650° C. to form a tin oxide layer having a given thickness.

The tin oxide film-coated glass plate was immersed in an alkali solution to examine a change in degree of whitening with the elapse of time.

When tin tetrachloride was used as the coating agent, the degree of whitening rapidly increased resulting in deteriorated quality of the layer. On the other hand, when dibutyltin dipivalate was used, the degree of whitening remained substantially unchanged, indicating that there was substantially no deterioration in quality of the layer.

Example 5

Test on Vapor Deposition onto Glass Bottle

A tin oxide layer was applied onto the outer surface of a glass bottle for beer in the same manner as in Example 4. The glass bottle was then subjected to alkali cleaning under the same conditions as used in a bottle cleaning liquid actually used in bottles for beer. At the outset, a given amount of an auxiliary detergent was mixed in a 4% alkaline solution, and the temperature was regulated to 80° C. The glass bottle with the tin oxide being coated thereon was immersed in the solution for a predetermined period of time. Thereafter, the bottle was taken out of the alkali solution, lightly rinsed, and then dried. The light transmission of the dried bottle was measured as an index of the degree of whitening. The results were as shown in FIG. 1. As is apparent from FIG. 1, as compared with the tin oxide layer formed using tin tetrachloride, the tin oxide layer formed using dibutyltin dipivalate had better fastness properties.

Example 6

Continuous Production Evaluation Test 1
(Laboratory Test Using Glass Piping)

A vaporized coating agent-containing gas was continuously flowed through glass piping, kept at 200° C., at a rate of 40 liters/min for one hr, and the interior of the glass piping was then inspected for the deposition or accumulation of by-products of the coating agent.

As a result, when dimethyltin dipivalate or dibutyltin dipivalate was used, neither deposition product nor accumulation product occurred within the glass piping. By contrast, when dibutyltin diacetate was used, the presence of a small amount of white decomposition products was confirmed.

Example 7

Continuous Production Evaluation Test 2 (Test Using Actual Line)

633-ml glass bottles heated to 600° C. or above were continuously coated by CVD while carrying the glass bottles at given intervals and a constant speed on a belt conveyor. In this case, a change in thickness of the layer formed on the outer surface of the glass bottles being continuously carried on the conveyor (bottle bottom being risen by 80 mm) was investigated. When dibutyltin dipivalate was used as the coating agent, the results were as shown in FIG. 2. Use of dibutyltin dipivalate as the coating agent caused only a small change in layer thickness and enabled the production of metal oxide-coated glass having a substantially even layer thickness in a continuous manner.

The layer thickness shown in FIG. 2 was measured in C.T.U. with a hot end coating meter manufactured by American Glass Research commonly used in the glass industry. The C.T.U. referred to herein is a mere optical unit used for process control, and does not have any physical meaning. However, it is said that 1 C.T.U. approximately corresponds to 4 Å. The adequacy of this value has also been confirmed by the present inventors using an ellipsometer (AEP-100, manufactured by Shimadzu Seisakusho Ltd.).

When dibutyltin diacetate was used as the coating agent, a deposition product occurred within the production apparatus in several minutes after the initiation of continuous production. This made it impossible to continue the continuous production.

What is claimed is:

1. A glass coating method comprising coating a glass bottle with a glass coating agent while maintaining the temperature of the glass 450 to 750° C. to form a metal oxide layer on the surface of the glass, wherein said glass coating agent comprises a metallic compound represented by formula (I):

$$R^1{}_{k-m}M(OCOR^2)_m \qquad (I)$$

wherein M represents a metal atom selected from the group consisting of tin, titanium, indium, silicon, zirconium, and aluminum;

$R^1$ represents a straight-chain, branched, or cyclic alkyl, alkenyl, or aryl group having 1 to 6 carbon atoms;

$R^2$ represents a branched alkyl group having 3 to 6 carbon atoms;

k is a number representing the valence of the metal atom M, and m is 2, and wherein said glass coating agent is in the form of a liquid, in the form of a dispersion or solution in a solvent, or in the form of a gas.

2. A glass coating method comprising coating a glass plate with a glass coating agent while maintaining the temperature of the glass at 450 to 750° C. to form a metal oxide layer on the surface of the glass, wherein said glass coating agent comprises a metallic compound represented by formula (1):

$$R^1{}_{k-m}M(OCOR^2)_m \qquad (I)$$

wherein M represents a metal atom selected from the group consisting of tin, titanium, indium, silicon, zirconium, and aluminum;

$R^1$ represents a straight-chain, branched, or cyclic alkyl, alkenyl, or aryl group having 1 to 6 carbon atoms;

$R^2$ represents a branched alkyl group having 3 to 6 carbon atoms;

k is a number representing the valence of the metal atom M, and m is 2, and wherein said glass coating agent is in the form of a liquid, in the form of a dispersion or solution in a solvent, or in the form of a gas.

3. A glass coating method according to claim 1, wherein the metallic compound is dibutyltin dipivalate, dibutyltin diisobutylate, dibutyltin dineoheptate, dibutyltin diisolactate, monobutyltin tripivalate, monomethyltin tripivalate, monobutyltin triisobutylate, dimethyltin dipivalate, dimethyltin diisobutylate, stannous pivalate, stannic pivalate, tributylsilyl pivalate, triisopropylsilyl pivalate, triisopropylsilyl isobutylate, dibutylsilyl dipivalate, diisopropylsilyl dipivalate, diphenylsilyl dipivalate, monophenylsilyl tripivalate, dimethyltitanium dipivalate, monobutylindium dipivalate, or diethylzirconium dipivalate.

4. A glass coating method according to claim 2, wherein the metallic compound is dibutyltin dipivalate, dibutyltin diisobutylate, dibutyltin dineoheptate, dibutyltin diisolactate, monobutyltin tripivalate, monomethyltin tripivalate, monobutyltin triisobutylate, dimethyltin dipivalate, dimethyltin diisobutylate, stannous pivalate, stannic pivalate, tributylsilyl pivalate, triisopropylsilyl pivalate, triisopropylsilyl isobutylate, dibutylsilyl dipivalate, diisopropylsilyl dipivalate, diphenylsilyl dipivalate, monophenylsilyl tripivalate, dimethyltitanium dipivalate, monobutylindium dipivalate, or diethylzirconium dipivalate.

5. A glass coating method according to claim 1, wherein the metallic compound is dibutyltin dipivalate.

6. A glass coating method according to claim 2, wherein the metallic compound is dibutyltin dipivalate.

7. A glass coating method according to claim 1, wherein said glass bottles are continuously coated with said coating agent by CVD while carrying the glass bottles at given intervals and constant speed on a conveyor belt.

8. A glass coating method according to claim 2, wherein said glass plates are continuously coated with said coating agent by CVD while carrying the glass plates at given intervals and constant speed on a conveyor belt.

* * * * *